(12) United States Patent
Yasuda et al.

(10) Patent No.: US 9,793,868 B2
(45) Date of Patent: Oct. 17, 2017

(54) DIGITAL ACOUSTIC SYSTEM

(71) Applicant: Trigence Semiconductor, Inc., Tokyo (JP)

(72) Inventors: Akira Yasuda, Tokyo (JP); Jun-ichi Okamura, Tokyo (JP)

(73) Assignee: Trigence Semiconductor, Inc., Tokyo (JP)

( * ) Notice: Subject to any disclaimer, the term of this patent is extended or adjusted under 35 U.S.C. 154(b) by 98 days.

(21) Appl. No.: 14/260,793

(22) Filed: Apr. 24, 2014

(65) Prior Publication Data

US 2014/0236332 A1    Aug. 21, 2014

Related U.S. Application Data

(63) Continuation of application No. PCT/JP2012/077570, filed on Oct. 25, 2012.

(30) Foreign Application Priority Data

Oct. 25, 2011    (JP) .................................. 2011-233937

(51) Int. Cl.
  *G06F 17/00* (2006.01)
  *H03F 3/217* (2006.01)
  (Continued)

(52) U.S. Cl.
  CPC ....... *H03F 3/2175* (2013.01); *G06F 17/3074* (2013.01); *H04H 20/88* (2013.01);
  (Continued)

(58) Field of Classification Search
  CPC ..... G11B 2020/10601; H03F 2200/331; H03F 3/2175; H04H 20/88
  See application file for complete search history.

(56) References Cited

U.S. PATENT DOCUMENTS 5,844,513 A * 12/1998 Nishio ............. G11B 20/10527
                                                   341/143
6,094,638 A *  7/2000 Ema ........................ H04S 1/007
                                                   704/502

(Continued)

FOREIGN PATENT DOCUMENTS

CN      101803401 A      8/2010
EP      2 187 657 A1     5/2010
(Continued)

OTHER PUBLICATIONS

Extended European Search Report dated Jun. 8, 2015 in corresponding European Patent Application No. 12843176.4.

(Continued)

*Primary Examiner* — Andrew C Flanders
(74) *Attorney, Agent, or Firm* — Typha IP LLC

(57) ABSTRACT

Provided is a digital acoustic system comprising: a ΔΣ modulator that modulates a digital input signal and outputs a digital signal; a post-filter that is connected to the ΔΣ modulator and which performs mismatch shaping to convert the digital signal; a parallel-serial converter that converts the digital signal converted by the post-filter into a digital signal which is serially transmitted; a serial-parallel converter that restores the digital signal converted by the parallel-serial converter; and a drive circuit which receives the digital signal restored by the serial-parallel converter, and drives drive elements to convert the signal into an analog audio signal.

1 Claim, 9 Drawing Sheets

(51) Int. Cl.
*H04R 3/00* (2006.01)
*H04H 20/88* (2008.01)
*H04R 1/00* (2006.01)
*G06F 17/30* (2006.01)
*H04R 9/06* (2006.01)
*H04R 27/00* (2006.01)

(52) U.S. Cl.
CPC ............... *H04R 1/005* (2013.01); *H04R 3/00* (2013.01); *H04R 9/063* (2013.01); *H04R 27/00* (2013.01); *H03F 2200/331* (2013.01); *H04R 2209/026* (2013.01); *H04R 2209/041* (2013.01); *H04R 2460/03* (2013.01)

(56) References Cited

U.S. PATENT DOCUMENTS

| | | | |
|---|---|---|---|
| 6,683,927 B1 * | 1/2004 | Ito | G11B 20/10527 375/260 |
| 7,058,463 B1 * | 6/2006 | Ruha | H03F 3/217 330/251 |
| 2009/0110217 A1 | 4/2009 | Yasuda et al. | |
| 2010/0239101 A1 | 9/2010 | Okamura et al. | |
| 2011/0160883 A1 | 6/2011 | Yasuda et al. | |

FOREIGN PATENT DOCUMENTS

| | | |
|---|---|---|
| JP | 2002-176362 | 6/2002 |
| JP | 2005-311847 | 11/2005 |
| JP | 2005-311847 A | 11/2005 |
| JP | 2006-197152 | 7/2006 |
| JP | 2006-197152 A | 7/2006 |
| JP | 2009-10820 | 1/2009 |
| JP | 2009-010820 A | 1/2009 |
| WO | 2007/135928 | 11/2007 |
| WO | WO 2011/074341 A1 | 6/2011 |

OTHER PUBLICATIONS

International Search Report dated Jan. 22, 2013 in corresponding International Patent Application No. PCT/JP2012/077570.
English Translation of Written opinion of the International Searching Authority with regard to PCT/JP2012/077570 dated Jan. 22, 2013.
Chinese Office Action regarding corresponding Chinese Patent Application No. 201280052756.X dated Jul. 6, 2016 with Partial English Translation.
Chinese Office Action dated Jan. 16, 2017 for Chinese Patent Application No. 201280052756.X with partial translation.
Japanese Office Action dated Jan. 4, 2017 for corresponding Japanese Application No. 2013-540824 with partial translation.

* cited by examiner

DIGITAL ACOUSTIC SYSTEM

CROSS REFERENCE TO RELATED APPLICATIONS

This application is a U.S. continuation application filed under 35 U.S.C. §111(a), of International application No. PCT/JP2012/077570, filed on Oct. 25, 2012, which claims priority to Japanese Patent Application No. 2011-233937, filed on Oct. 25, 2011, the disclose of which are incorporated by reference.

BACKGROUND

Technical Field

The present invention relates to a digital acoustic system using a digital speaker apparatus which directly converts a digital signal into analog audio and applications thereof.

Description of Related Art

Digital speaker technology to directly convert a digital signal into analog audio has been proposed (for example, refer to WO 2007/135928).

A method of directly converting analog audio using a circuit which is input with two digital signals X (L) and Y (R) and which outputs a plurality of digital signals by $\Delta\Sigma$-modulator and a mismatch shaping filter circuit wherein a plurality of speakers or a plurality of elements are driven by the plurality of digital signals is shown in FIG. 22 of Patent Document 1.

This type of digital speaker apparatus using digital speaker technology which directly converts a digital signal into analog audio has smaller power consumption compared to an analog speaker apparatus driven by an analog electric signal. In addition to this, since this type of digital speaker apparatus uses a plurality of speaker elements or a plurality of driving elements (such as coils), it is possible to output a large sounds compared to a conventional single speaker or a speaker that uses a single drive element.

However, in a digital speaker apparatus a circuit that outputs a plurality of digital signals using a digital signal from a PCM sound source using a $\Delta\Sigma$-modulator and mismatch shaping filter circuit is essential and it is necessary to use a fine digital process to implement the circuits on an LSI.

FIG. 1 shows a conventional example of a digital speaker apparatus system as a typical example of a digital acoustic system using a conventional digital speaker apparatus. This conventional digital speaker apparatus system is composed of a circuit for outputting a plurality of digital signals by a $\Delta\Sigma$-modulator, a post-filter circuit, and a plurality of speaker driving elements. A one bit digital input signal (110) is input to a $\Delta\Sigma$-modulator (101) and converted to a plurality of n bit digital signals (111) by the $\Delta\Sigma$-modulator (101). The plurality of n bit digital signals are converted to mismatch shaped m number of digital signals by a post-filter (112). The m number of digital signals are converted directly to analog audio by inputting to a speaker drive circuit (103) and driving s number of drive elements (104). The $\Delta\Sigma$-modulator (101), the post-filter (102), and the speaker driving circuit (103) are structural elements of a digital speaker apparatus.

SUMMARY

In a conventional example, because the $\Delta\Sigma$-modulator (101), the post-filter (102), and the speaker driving circuit (102) (103) are required for each speaker, a plurality of fine digital process LSI's are necessary in the case where a digital speaker apparatus is used in a cinema or in a theater, where a plurality of speakers are used.

The present invention aims to provide an optimal digital acoustic system for a digital speaker apparatus which directly converts analog audio using a plurality of speakers (coils) driven by a digital signal.

As one embodiment of the present invention, a digital acoustic system is provided including a $\Delta\Sigma$-modulator configured to modulate a digital signal and outputting an n bit digital signal, a post filter connected to the $\Delta\Sigma$-modulator and configured to convert the n bit digital signal to m number of digital signals by mismatch shaping, a parallel-serial converter configured to convert the m number of digital signals converted by the post filter to a serially transmitted digital signal, a serial-parallel converter configured to convert and reconstruct the digital signal converted by parallel-serial converter to m number of digital signals, and a driving circuit configured to receive the m number of digital signals reconstructed by the serial-parallel converter, drive s number of driving elements for conversion to analog audio.

As one embodiment of the present invention, a digital acoustic system is provided including a processor configured to convert a digital input signal to m number of digital signals, a parallel-serial converter configured to convert the m number of digital signals converted by the processor to a serially transmitted digital signal, a serial-parallel converter configured to convert and reconstruct the digital signal converted by parallel-serial converter to m number of digital signals, and a driving circuit configured to receive the m number of digital signals reconstructed by the serial-parallel converter, drive s number of driving elements for conversion to analog audio, wherein the processor is controlled by a program for operating the processor as a $\Delta\Sigma$-modulator modulating a digital signal and outputting an n bit digital signal, and a post filter connected to the $\Delta\Sigma$ modulator and configured to convert the n bit digital signal and to m number of digital signals by mismatch shaping.

DESCRIPTION OF EMBODIMENTS

First Embodiment

Figure 1:
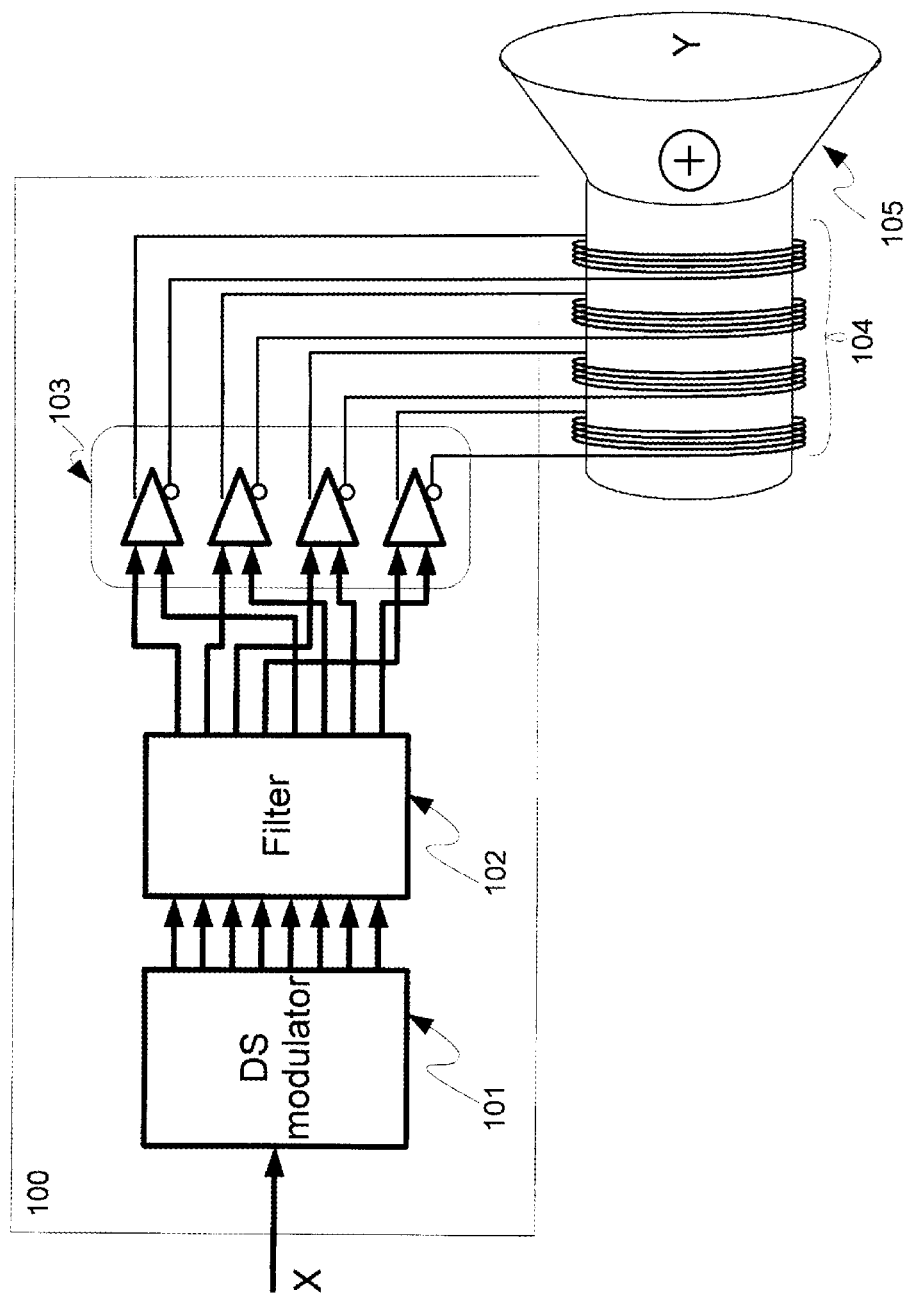
FIG. 1 is an example of a structure of a conventional digital acoustic system.
Figure 2:
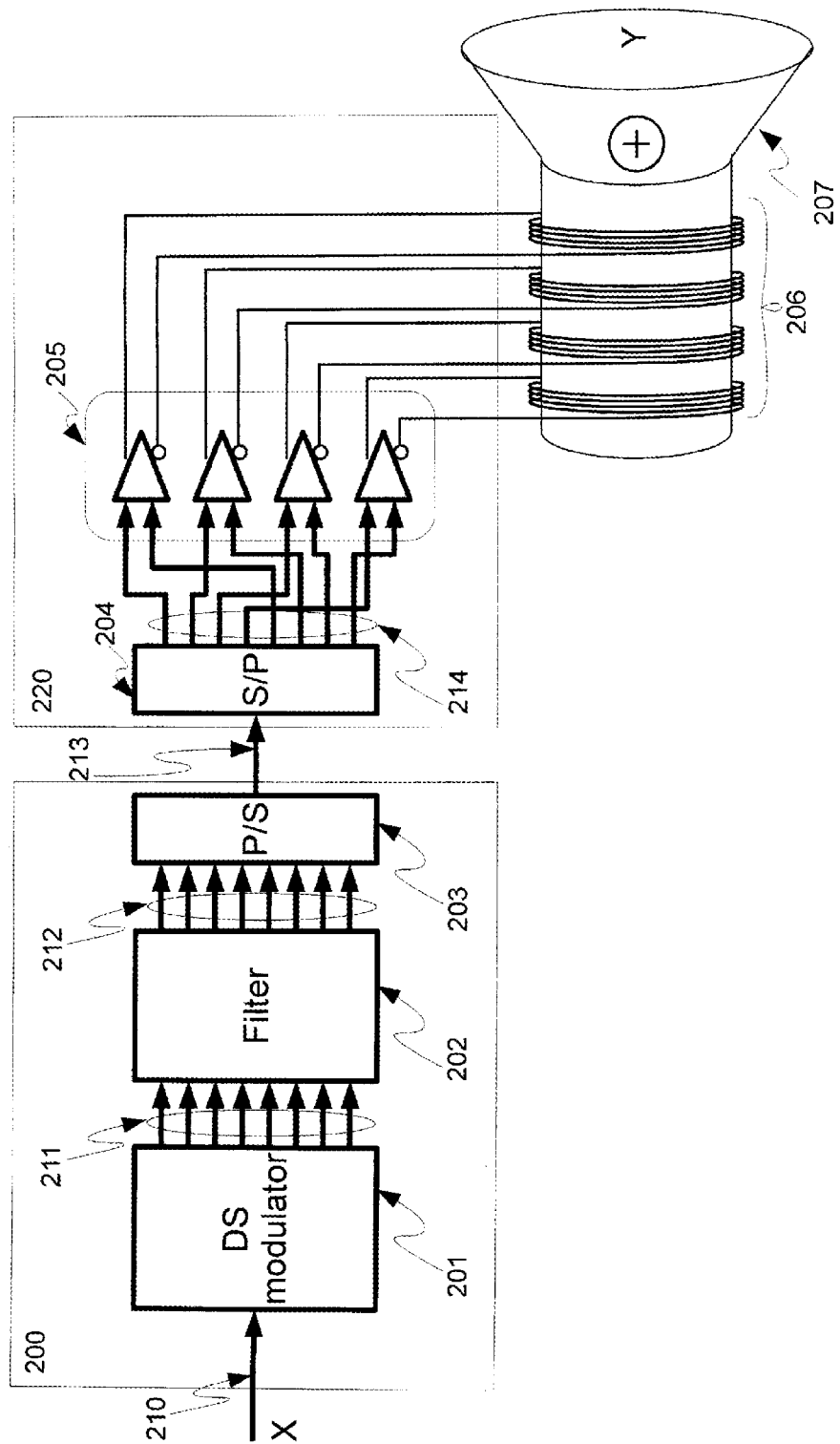
FIG. 2 is a structural diagram of a digital acoustic system according to a first embodiment of the present invention.

A structure of a digital acoustic system which uses a digital speaker apparatus according to a first embodiment of the present invention is shown in FIG. 2. The digital speaker apparatus according to the present embodiment is composed of a device for outputting a plurality of digital signals from a digital signal, and a driving device for driving a plurality of speaker driving elements using the plurality of digital signals output by this device. One of the features of the present embodiment is that the device for outputting the plurality of digital signals and the driving device for driving the speaker driving the elements are connected by a parallel-to-serial converter and a serial-to-parallel converter.

Referring to FIG. 2, a digital input signal (210) is input to a ΔΣ-modulator (201), and converted to a plurality of n bit digital signals (211) by the ΔΣ-modulator (201). The plurality of n bit digital signals are converted to m number of digital signals (212) which is mismatch shaped by a post-filter (202). The m number of digital signals is converted by a parallel-serial converter (203) to digital signals (213) to be transmitted serially and reconstructed by a serial-parallel converter (204) to m number of digital signals (214). Although it is possible to give one as an example of the number of bit of the digital signal (213) to be transmitted serially, the present invention is not limited to one. A speaker driving circuit (205) which receives the m number of digital signals (214) drives the s number of driving elements (206) and analog audio is directly converted by a diaphragm (207). Here, the ΔΣ-modulator (201), the post-filter (202), and the parallel-serial converter (203) form an apparatus (200) which outputs a plurality of digital signals from a digital signal. In addition, the serial-parallel converter (204) and the speaking driving circuit (205) form a driving device (220) which drives speaker driving elements.

As in the present embodiment, it is possible to connect a device for outputting a plurality of digital signals from an input digital signal and a driving device for driving speaker driving elements using a serial signal, and it is possible to connect the driving device which drives a plurality of speaker driving elements to the device which outputs the plurality of digital signals from the digital signal by a serial signal. Therefore, it is possible to construct a digital acoustic system by combining simple devices compared to a conventional acoustic system even when using digital speaker apparatuses in a cinema or a theatre, for example, where a plurality of speakers are used. In this way, it is possible to reduce the cost of a digital acoustic system.

As an example of the structure according to the first embodiment shown in FIG. 2, an example is shown whereby a device for outputting a plurality of digital signals from a digital signal is electrically connected by a serial signal to a driving device for driving speaker driving elements. However, the present embodiment is not limited to this example, and a structure whereby a serial signal is connected by a wireless device, connected by an optical signal, or transmitted by the intensity of electromagnetic induction or an electric field are included in the present embodiment. In addition, an example of converting a parallel signal into a plurality of serial signals using the parallel-serial converter (203) shown in FIG. 2 is also included.

In addition, by separating a driving device for driving speaker driving elements from a device for outputting a plurality of digital signals from a digital signal, it is possible to advance usage of LSIs using an optimum device technology for each device. In this way, it is possible to reduce the overall system cost and increase an operating voltage of the driving device side for driving speaker driving elements. Therefore, it is possible to easily reproduce a large volume sound without an increase in cost.

Second Embodiment

Figure 3:
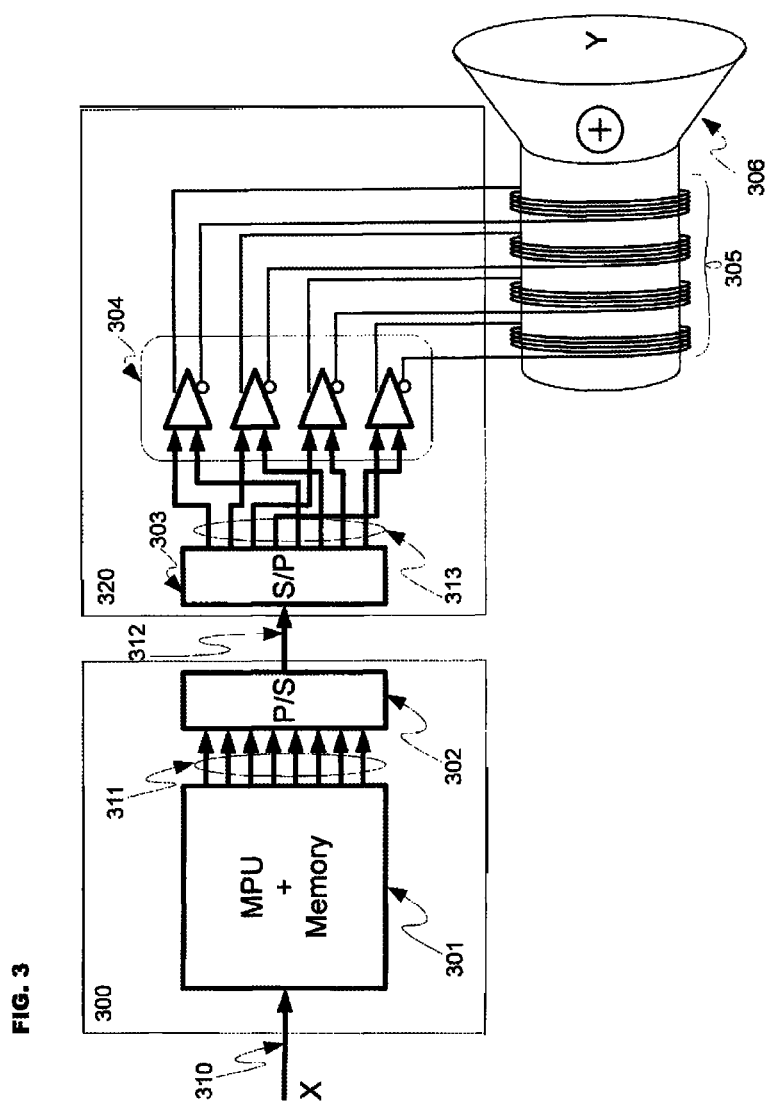
FIG. 3 is a structural diagram of an acoustic system according to a second embodiment of the present invention.

FIG. 3 shows a structure of a digital speaker apparatus including a circuit for outputting a plurality of digital signals and a plurality of speaker driving elements according to a third embodiment of the present invention. A digital input signal (310) is input to a microcomputer (301) and converted to m number of digital signals (311) by mismatch shaping. The m number of digital signals are converted to a 1 bit digital signal (312) by a parallel-serial converter (302) and reconstructed to m number of digital signals (313) by a serial-parallel converter (303). A speaker driving circuit (304) which receives the m number of digital signals (214) drives s number of driving elements (305) and analog audio is directly converted by a diaphragm (306).

Here, the microcomputer device (301) and the parallel-serial converter (302) form a device (300) for outputting a plurality of digital signals from a digital signal, and the serial-to-parallel converter (303) and the speaker driving circuit (304) form a driving device (320). A speaker driving element is driven in the driving device (320). The microcomputer device (301) has a processor, and the processor is controlled by a program for operating the processor as a ΔΣ-modulator that modulates a digital signal and outputs an n bit digital signal, and as a post filer which is connected to the ΔΣ-modulator and which converts the n bit digital signal by mismatch shaping into m number of digital signals.

As in the present embodiment, by using a microcomputer device having a processor as a device for outputting a plurality of digital signals from a digital signal being input, it is possible to perform similar digital signal processing by using a program as that performed by using a ΔΣ-modulator and a post filter of the first embodiment. By processing using a program, it is possible to update and improve the modulation characteristics of the ΔΣ-modulator and the filter characteristics in the post-filter without changing any hardware.

Third Embodiment

Figure 4:
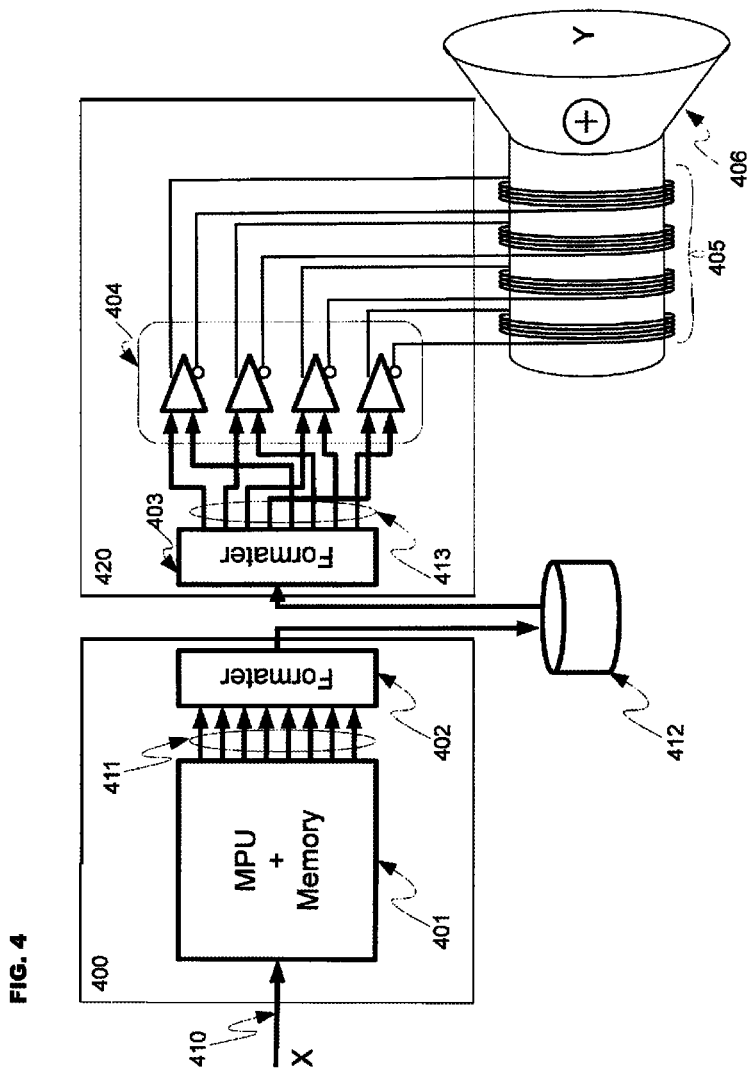
FIG. 4 is a structural diagram of a digital acoustic system according to a third embodiment of the present invention.

FIG. 4 shows a third embodiment of a digital speaker apparatus, as an embodiment of a system, comprised of a circuit for outputting a plurality of digital signals and a plurality of speaker driving elements. A digital input signal (410) is input to a microcomputer device (401) and converted to m number of digital signals (411) by mismatch shaping. The m number of digital signals are recorded once into a storage device (312) by a format converter (402) and again reconstructed to m number of digital signals by a format converter (403). Furthermore, the output of the format converter (402) may be converted to a digital signal that is serially transmitted by a parallel-serial converter. Or the digital signal may be stored in the storage device (312). In addition, a digital signal read out from the storage device (312) may be input to the serial-to-parallel converter and then input to the format converter (403). Furthermore, the format converter (402) may include a parallel-serial converter and the format converter (403) may be configured to include a serial-parallel converter.

A speaker driving circuit (404) which receives the m number of digital signal (414) drives s number of driving elements (405) and analog audio is directly converted by a diaphragm (406). Here, the microcomputer unit (401) and the format converter (402) form a device (400) for outputting a plurality of digital signals from a digital signal. In addition, the format converter (403) and the speaker driving circuit (404) form a driving device (420) for driving speaker driving elements.

When it is possible to connect for a device for outputting a plurality of digital signals from a digital signal and a driving device for driving speaker driving elements via a storage device as in the third embodiment, it is possible to perform similar digital signal processing to that performed using a $\Delta\Sigma$-modulator and a post-filter and of the first embodiment, even when a microcomputer device with a slow processing speed is used such that a real-time processing of audio reproduction, for example, cannot be performed by the microcomputer, and a digital acoustic system with lower power consumption compared to a conventional digital acoustic system can be achieved.

In addition, in the case where a result of processing a digital signal using a program is reproduced multiple times, because it is sufficient to just read out the pre-calculated results from a storage device, there is no longer a need for recalculation and thus a digital acoustic system with lower power consumption compared to a conventional digital acoustic system can be achieved.

Furthermore, it is possible to perform lossless data compression with respect to mismatch shaping of m number of digital signals in the format converter (402). Data is expanded and the original m number of digital signals are reproduced in the format converter (403). It is possible to significantly reduce the necessary capacity of a storage media by compressing the data in this way. Here, in the compression and expansion method of the data, it is possible to achieve the optimum size of the storage media and hardware by considering and selecting the calculation amount and data compression ratio.

Fourth Embodiment

Figure 5:
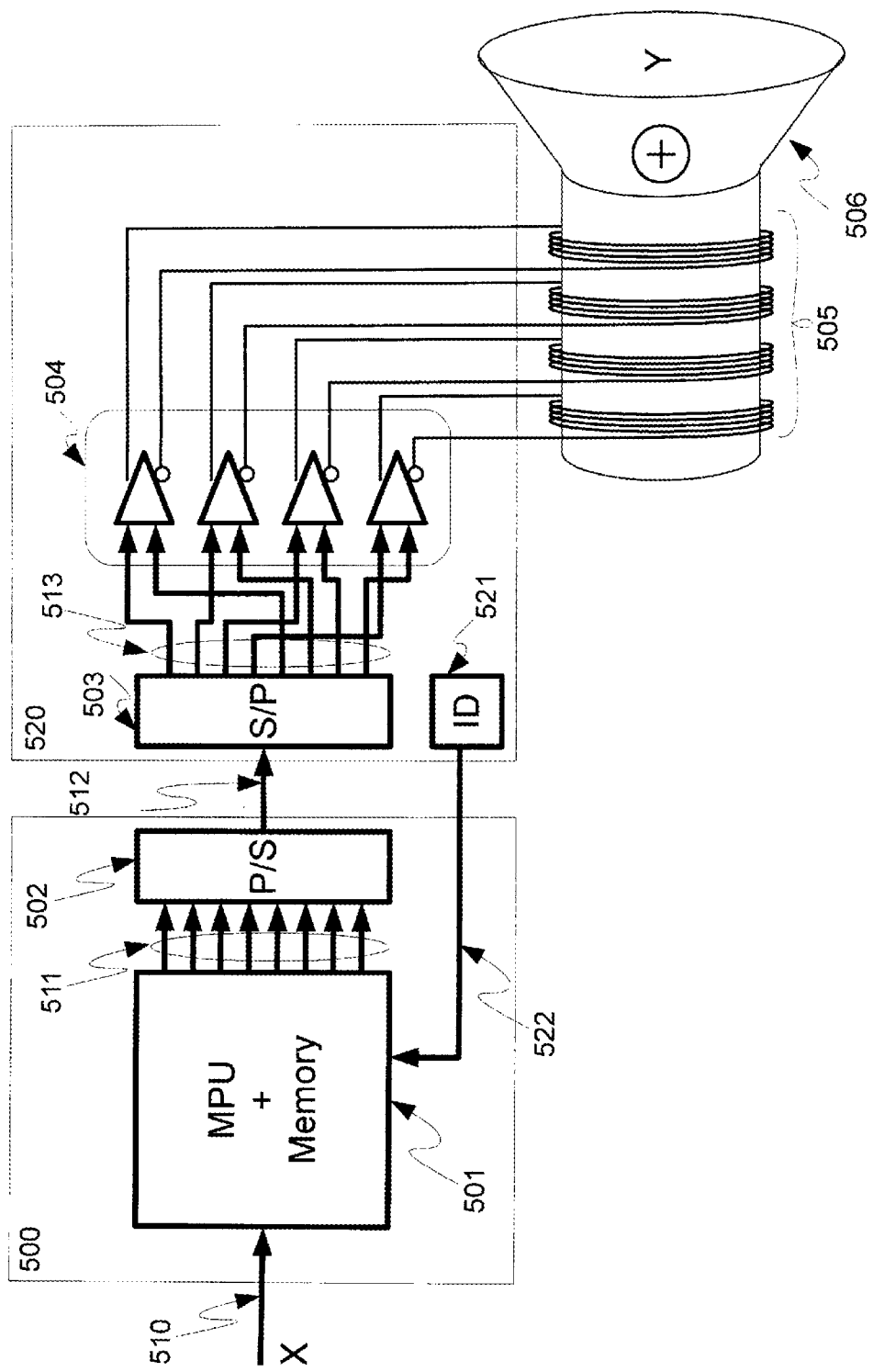
FIG. 5 is a structural diagram of a digital acoustic system according to a fourth embodiment of the present invention.

FIG. 5 shows a fourth embodiment of a digital speaker apparatus, as an embodiment of a system, comprising a circuit for outputting a plurality of digital signals and a plurality of speaker driving elements. A digital input signal (510) is input to a microcomputer device (501) and converted to m number of digital signals (511) by mismatch shaping. The m number of digital signals are serially transmitted by a parallel-serial converter (502), for example, are once converted to a one-bit digital signal (512), and again reconstructed to m number of digital signals (513) by a serial-parallel converter (513). A speaker driving circuit (504) which receives the m number of digital signals drives s number of driving elements (505) and analog audio is directly converted by a diaphragm (506). Here, the microcomputer device (501) and the parallel-serial converter (502) form a device (500) for outputting a plurality of digital signals from a digital signal. In addition, the serial-parallel converter (503) and the speaker driving circuit (504) form a driving device (520) for driving speaker driving elements. Furthermore, the driving device (520) is arranged with an ID element (521) that stores a number and a characteristic of speaker drive circuits, and a transmission means (522) is arranged for transmitting the data from the ID element to the device (500) for outputting a plurality of digital signals. The transmission means (522) transmits data from the ID element (521) to the microcomputer device (501).

By using a microcomputer device as a device for outputting a plurality of digital signals from a digital signal as in the present embodiment, it is possible to perform similar digital signal processing using a program as that performed using a $\Delta\Sigma$-modulator and a post filter of the first embodiment. Furthermore, by utilizing the data of the driving device (520), since it possible to manage digital signal processing adapted to a number and a characteristic of the driving circuit using a program, it is possible to connect different driving devices to a single device for outputting a plurality of digital signals.

Fifth Embodiment

Figure 6:
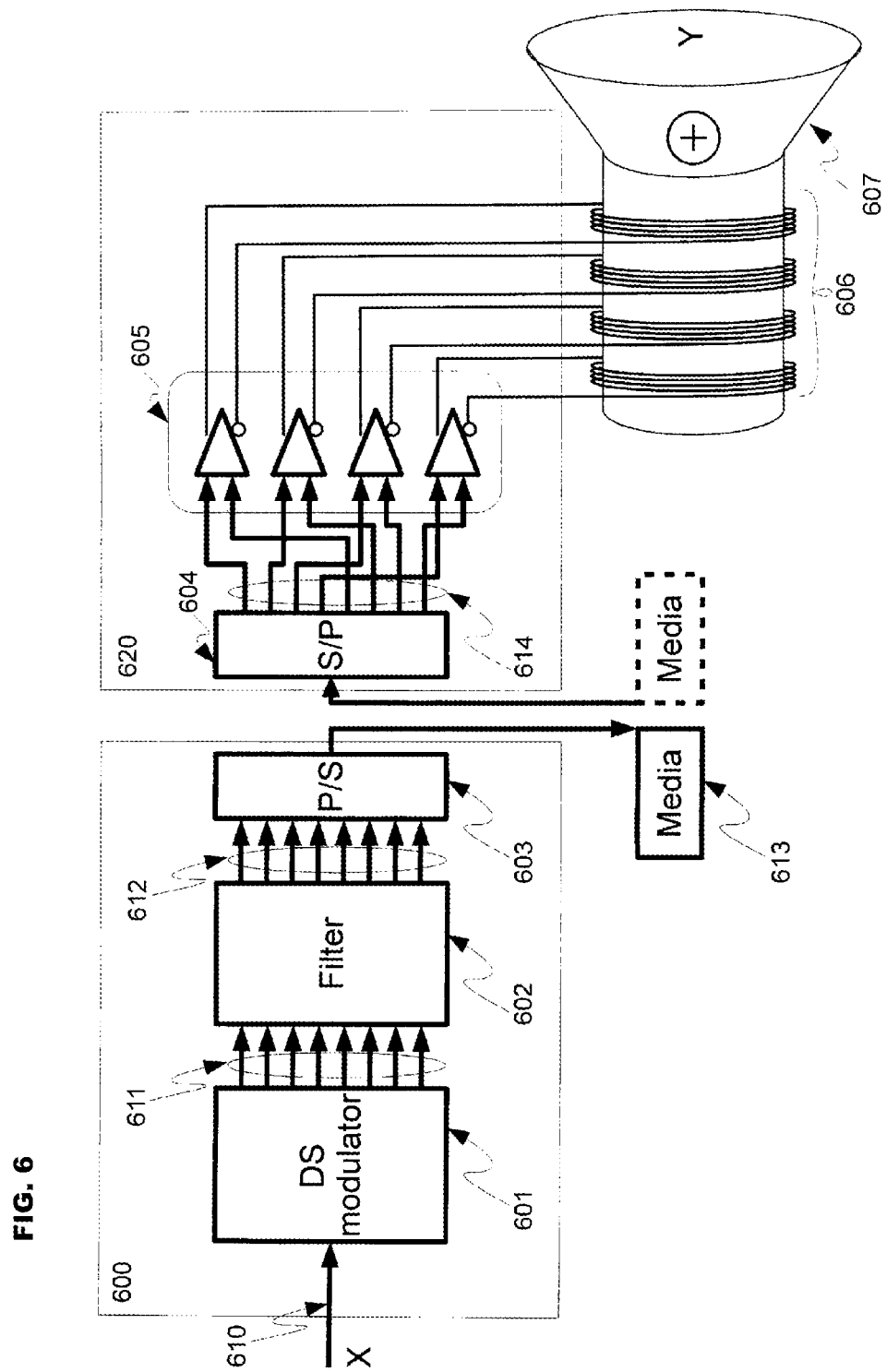
FIG. 6 is a structural diagram of a digital acoustic system according to a fifth embodiment of the present invention.

FIG. 6 shows a fifth embodiment of a digital speaker apparatus, as an embodiment of a system, comprising a circuit for outputting a plurality of digital signals and a plurality of speaker driving elements. As with the third embodiment shown in FIG. 4, it is possible to generate in advance a plurality of signals for driving a plurality of speaker driving elements using a device (600) for outputting a plurality of digital signals from a digital signal, and store them in a storage media (613). In this way it is possible to circulate converted data in a storage media (613). By delivering data converted in advance directly to customers via a network, or circulating the data converted in advance to a storage media, the format converter (602) which was previously required is no longer required to be prepared on the device side for playing audio and it is possible to provide a less expensive digital speaker apparatus.

Media such as an optical disk or a memory card can be exemplified as a storage media. It is preferred that these media can be attached to and detached from the storage device. Therefore, audio reproduction may be performed by attaching the optical disc or the memory card to a driving device (620) as a stationary or a mobile playback device. In addition, in the case of distribution directly to a customer via a network or by streaming, data distributed to a customer's storage media may be recorded once.

Furthermore, by generating and storing data suitable to several sets of numbers of driving elements in advance, it is possible to adapt to a digital speaker system with a different number of driving elements. This method is an effective means to increase recording density of a storage media and reduce costs where unit price is low.

In addition, because an output from the device (600) which outputs a plurality of digital signals from a signal for driving a plurality of speaker driving elements is digitally modulated, it is sometimes difficult to reconstruct the digital signal before modulation. Therefore, it is possible to provide an effect equal to copy protection to the output from the device (600). In order to further increase the degree of security, it is possible perform encryption or superimpose data with a watermark when recording to a storage media. Because a $\Delta\Sigma$-modulator (601) is used, by inserting a watermark signal to a band (the frequency band above the regular signal band) of outside of a signal band such as a music signal, it is possible to use a watermark with minimal degradation in sound quality when a final conversion to an audio signal. Encryption or superimposition of electronic watermark data can, for example, be performed using the post filter (602) or the parallel-serial converter (603). For example, a device for encryption or superimposing watermark data may be arranged in the $\Delta\Sigma$-modulator (601), the post filter (602), or the parallel-to-serial converter (603). In addition, such a device may be an independent device.

Furthermore, by storing data, in a storage media, which can change the number of coils used, or by storing only one type of data, it is possible to adapt to a plurality of cases for numbers of coils and improve convenience.

Sixth Embodiment

Figure 7:
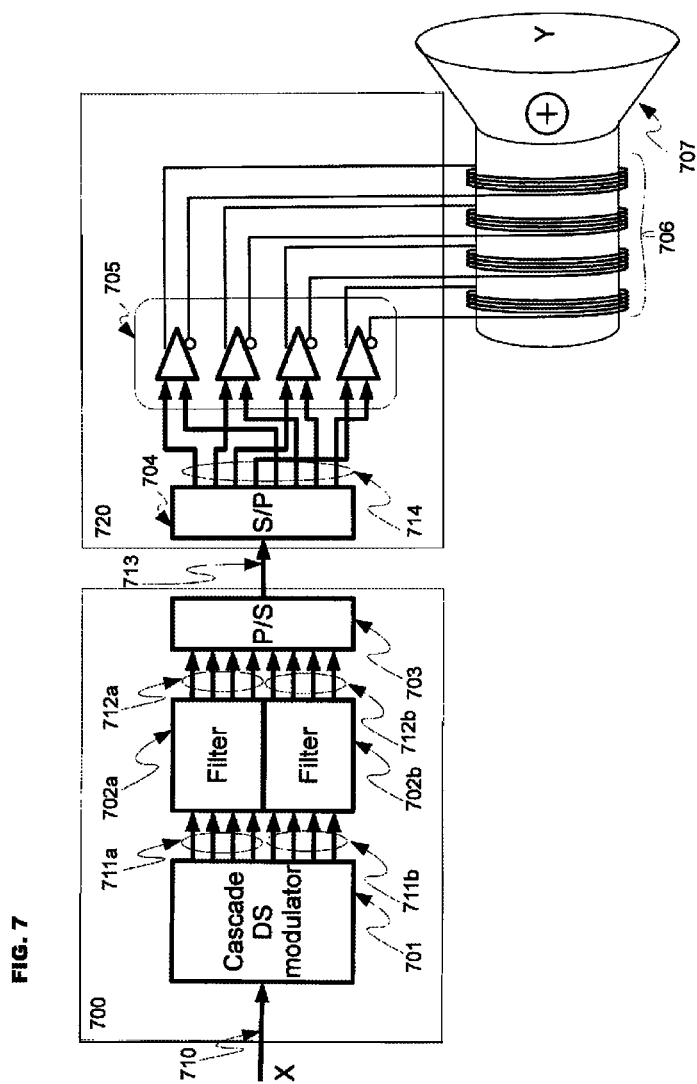
FIG. 7 is a structural diagram of a digital acoustic system according to a sixth embodiment of the present invention.

It is possible to use a cascade type ΔΣ-modulator as a ΔΣ-modulator in the first to fifth embodiments. FIG. 7 shows an embodiment in the case where a multi-bi ΔΣ-modulator is used as an internal quantizer of a cascade type ΔΣ modulator. In a cascade type ΔΣ modulator (701), a plurality of internal ΔΣ-modulators after a first stage and a second stage is output. A plurality of first stage $n_1$ bit digital signals (711a) is converted to $m_1$ number of digital signals (712a) by mismatch shaping using a post-filter (702a). Frequency characteristics are added by a post-filter (702b) to $n_x$ outputs (711b) after the second stage, and further converted to $m_x$ number of digital signals (712b) by mismatch shaping.

$m_1+m_2+\ldots+m_x$ number of digital signals are converted once to a one bit digital signal (713) by a parallel-serial converter (703), and again reconstructed to $m_1+m_2+\ldots+m_x$ number of digital signals (714) by a serial-parallel converter (704). A speaker driving circuit (705) which receives the $m_1+m_2+\ldots+m_x$ number of digital signals (714) drives s number of driving elements (706) and analog audio is direct converted by a diaphragm (707). Here, the cascade type ΔΣ modulator device (701), the post filters (702a, b), and the parallel-serial converter (703) form a device (700) for outputting a plurality of digital signals from a digital signal. In addition, the serial-to-parallel converter (705) and the speaker driving circuit (705) form a driving device (720) for driving speaker driving elements.

As with the cascading type ΔΣ DAC, output after the second stage has a code for canceling a noise component included in the first stage output. Therefore, in the case where there are less driving elements than $m_1+m_2+\ldots+m_x$, it is possible to perform conversion at a sufficiently high accuracy without using $m_2 \ldots m_x$ of subsequent stages.

Seventh Embodiment

Figure 8:
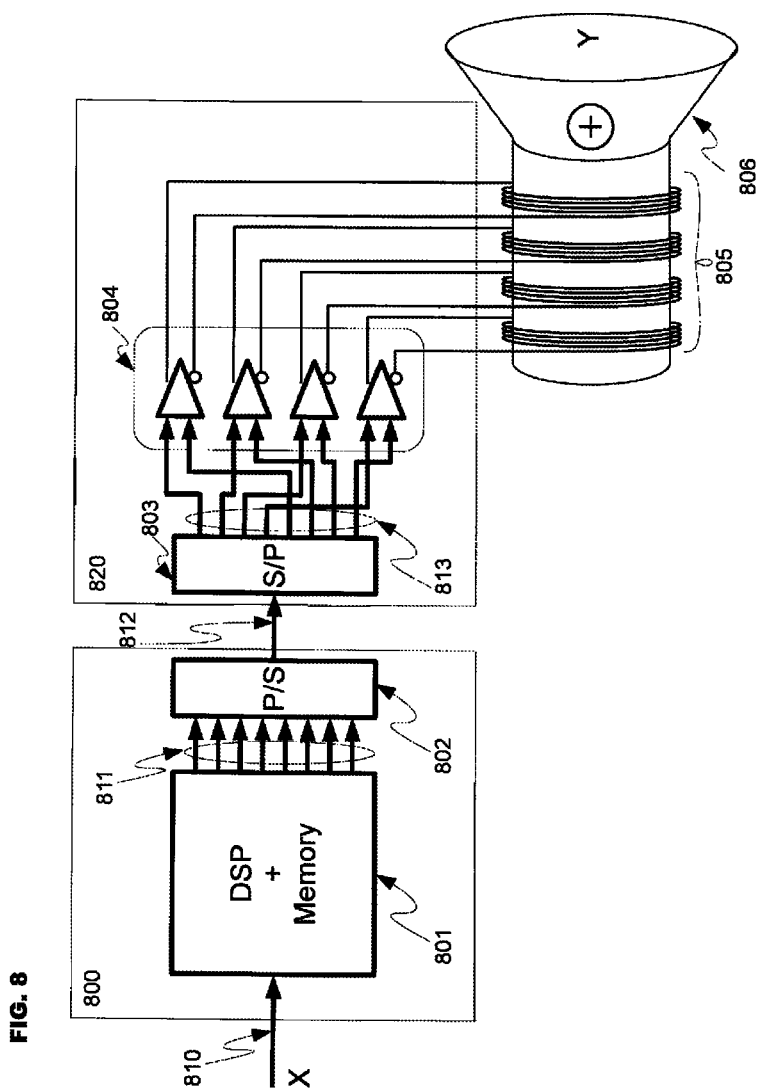
FIG. 8 is a structural diagram of a digital acoustic system according to a seventh embodiment of the present invention.

FIG. 8 shows a structure of a digital speaker apparatus arranged with a circuit for outputting a plurality of digital signals and a plurality of speaker driving elements related to a seventh embodiment of the present invention. A digital signal 810 is input to a digital signal processor device (DSP) (801) and converted to m number of digital signals (811) by mismatch shaping. The m number of digital signals (811) are converted to s number of digital signals (812) by a parallel-serial converter (802), and reconstructed to m number of the digital signals (813) by a serial-parallel converter (803). A speaker driving circuit (804) which receives the m number of digital signals (814) drives s number of driving elements (805) and analog audio is directly converted directly by diaphragm (806).

The relationship between the number of the input digital signals of the parallel-to-serial converter (802) and the number of output digital signals is s<m and required data for demodulation by the serial-parallel converter (803) is included in the s number of digital signals (812).

Here, a digital signal processor device (801) and the parallel-serial converter (802) form a device (800) for outputting a plurality of digital signals from a digital signal 810, and the serial-to-parallel converter (803) and the speaker driving circuit (804) for a driving device (820). Speaker driving elements are driven in the driving device (820).

As in the present exemplary embodiment, by using a digital signal processor device as a device for outputting a plurality of digital signals from a digital signal being input, it is possible to perform similar digital signal processing using a program as that performed using a ΔΣ-modulator and a post filter of the first embodiment. By processing using a program, it is possible to further update and improve the modulation characteristics of the ΔΣ-modulator and filter characteristics in the post-filter without changing any hardware.

Eighth Embodiment

Figure 9:
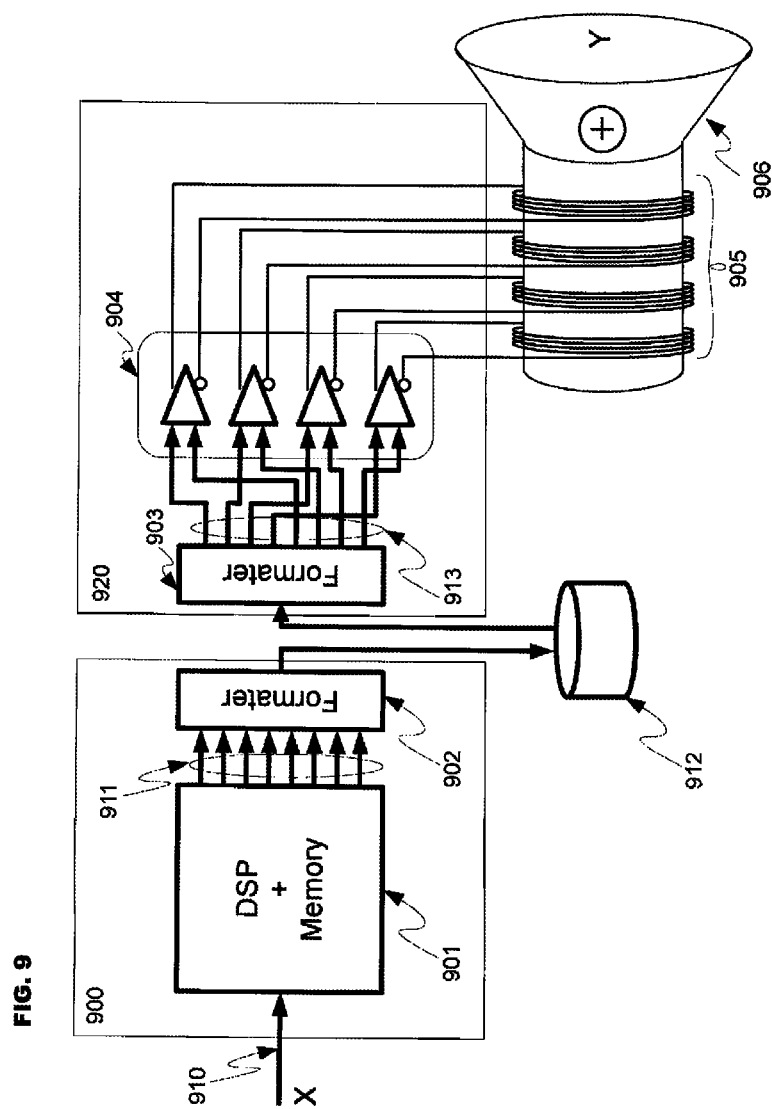
FIG. 9 is a structural diagram of a digital acoustic system according to an eighth embodiment of the present invention.

FIG. 9 shows a form of a digital speaker apparatus as an embodiment of a system, comprised from a circuit for outputting a plurality of digital signals and a plurality of speaker driving elements. A digital signal (910) is input to a digital signal processor (microcomputer device) (901) and converted to m number of digital signals (811) by mismatch shaping. The format of the m number of digital signals are converted by a format converter (902) and the m number of digital signals are output as data representing the m number of digital signals. The m number of digital signals output from the format converter (902) may be stored once in a storage media such as the storage device (912) shown in FIG. 9. In this case, the format conversion by the format converter (902) is performed as a conversion to a format suitable for storage in the storage media. The data representing a digital signal of the m number of digital signals stored in the storage media of the storage device (912) is again reconstructed to m number of digital signals (913) by a format converter (903). A speaker driving circuit (904) which receives the m number of digital signals (913) drives s number of driving elements (905) and analog audio is converted directly by a diaphragm (906). Here, the microcomputer device (901) and the format converter (902) form a device (900) for outputting a plurality of digital signals from a digital signal being input. In addition, the format converter (903) and the speaker driving circuit (904) form a driving device (920) for driving a speaker driving element.

In addition, the m number of digital signals output from the format converter (902) may be output to a transmission path and transmitted. For example, the transmission may be transmitted by communication or broadcasted at the same time to multiple recipients. Transmission may be wireless or may be wired. In this case, the receiver receives the m number of digital signals which are reconstructed to m number of digital signals (913) by the format converter (903). The subsequent processing is as described above.

Here, it is possible to use any kind of digital format which is reversibly convertible as a format converted by the format converter (902).

As in the eighth embodiment, it is possible to connect a device for outputting a plurality of digital signals from a digital signal being input and a driving device for driving speaker driving elements via a storage device or a transmission path. In particular, in the case of using a storage device, even when a digital signal processor with a slow processing speed is used such that a real-time processing of audio reproduction cannot be performed, for example, it is possible to perform similar digital signal processing to that performed using a ΔΣ-modulator and a post-filter of the first embodiment, a digital acoustic system with lower power consumption compared to a conventional digital acoustic system can be achieved.

In addition, in the case where a result of processing a digital signal using a program is reproduced multiple times, because it is sufficient to just read out the pre-calculated results from a storage device, there is no longer a need for recalculation and thus a digital acoustic system with lower power consumption compared to a conventional digital acoustic system can be achieved.

Furthermore, it is possible to perform a lossless data compression with respect to m number of digital signals after mismatch shaping in the format converter (902). Data is expanded and the original m number of digital signals are reproduced in the format converter (903). It is possible to significantly reduce the necessary capacity of a storage media by compressing the data in this way. Here, in the compression and expansion method of the data, it is possible to achieve the optimum size of the storage media and hardware by considering and selecting the calculation amount and data compression ratio.

In this way, in the present embodiment, even in the case where the same serial signal is used, it is possible to change the number of coils in a digital speaker unit.

In particular, in the third and fifth embodiments, although data is generated in advance, because it is possible to select the number of coils used in the reproduction side, it is not necessary to prepare in advance the data made to correspond to a plurality of cases in number of coils and it is possible to reduce the amount of data.

According to the present invention, it is possible to reduce the cost of a digital acoustic system since it is possible to construct a digital acoustic system by combining simple devices compared to a conventional acoustic system even when using a digital speaker apparatus in cinemas or theatres with the purpose of using a plurality of speakers without losing the feature of low power consumption.

What is claimed is:

1. A digital acoustic system comprising:
a processor configured to convert a single digital input audio signal to m number of digital signals;
a parallel-serial converter configured to convert the m number of digital signals converted by the processor to a serially transmitted digital signal;
a serial-parallel converter configured to convert and reconstruct the digital signal converted by parallel-serial converter to m number of digital signals; and
a driving circuit configured to receive the m number of digital signals reconstructed by the serial-parallel converter, to realize conversion to analog audio by driving s number of driving elements;
wherein the processor is controlled by a program for reading out the s number of driving elements, for operating the processor as a single $\Delta\Sigma$-modulator modulating the single digital input audio signal and outputting an n bit digital signal, and as a post filter connected to the $\Delta\Sigma$-modulator and configured to mismatch shape the n bit digital signal and convert the n bit digital signal to m number of digital signals; and
the number of signals output by the parallel-serial converter is smaller than the number of signals input to the parallel-serial converter, and a signal output by the parallel-serial converter includes data necessary for demodulation by the serial-parallel converter.

* * * * *